(12) United States Patent
Umezaki et al.

(10) Patent No.: US 9,017,571 B2
(45) Date of Patent: Apr. 28, 2015

(54) DRY ETCHING AGENT AND DRY ETCHING METHOD

(75) Inventors: Tomonori Umezaki, Ube (JP); Yasuo Hibino, Shiki (JP); Isamu Mori, Tokyo (JP); Satoru Okamoto, Fujimoto (JP); Akiou Kikuchi, Ube (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 13/808,506

(22) PCT Filed: Jun. 24, 2011

(86) PCT No.: PCT/JP2011/064524
§ 371 (c)(1),
(2), (4) Date: Jan. 4, 2013

(87) PCT Pub. No.: WO2012/008282
PCT Pub. Date: Jan. 19, 2012

(65) Prior Publication Data
US 2013/0105728 A1    May 2, 2013

(30) Foreign Application Priority Data

Jul. 12, 2010  (JP) ................................. 2010-158010
Nov. 2, 2010   (JP) ................................. 2010-246670
Jun. 21, 2011  (JP) ................................. 2011-137022

(51) Int. Cl.
*C09K 13/00*     (2006.01)
*C09K 13/04*     (2006.01)
(Continued)

(52) U.S. Cl.
CPC .......... *C09K 13/00* (2013.01); *H01L 21/31116* (2013.01); *C09K 13/08* (2013.01)

(58) Field of Classification Search
None
See application file for complete search history.

(56) References Cited

U.S. PATENT DOCUMENTS 5,814,563 A  *  9/1998  Ding et al. .................... 438/714
6,387,287 B1     5/2002  Hung et al.
(Continued)

FOREIGN PATENT DOCUMENTS

CN    101038875 A    9/2007
JP    9-191002 A     7/1997
(Continued)

OTHER PUBLICATIONS

Corresponding International Search Report with English Translation dated Sep. 6, 2011 (five (5) pages).
(Continued)

*Primary Examiner* — Duy Deo
(74) *Attorney, Agent, or Firm* — Crowell & Moring LLP

(57) ABSTRACT

A dry etching agent according to the present invention preferably contains: (A) 1,3,3,3-tetrafluoropropene; (B) at least one kind of additive gas selected from the group consisting of $H_2$, $O_2$, $O_3$, CO, $CO_2$, $COCl_2$, $COF_2$, $CF_3OF$, $NO_2$, $F_2$, $NF_3$, $Cl_2$, $Br_2$, $I_2$, $CH_4$, $C_2H_2$, $C_2H_4$, $C_2H_6$, $C_3H_4$, $C_3H_6$, $C_3H_8$, HF, HI, HBr, HCl, NO, $NH_3$ and $YF_n$ (where Y represents Cl, Br or I; and n represents an integer satisfying $1 \leq n \leq 7$); and (C) an inert gas. This dry etching agent has less effect on the global environment and can obtain a significant improvement in process window and address processing requirements such as low side etching ratio and high aspect ratio even without any special substrate excitation operation.

20 Claims, 1 Drawing Sheet

(51) Int. Cl.
*C09K 13/08* (2006.01)
*C09K 13/06* (2006.01)
*H01L 21/311* (2006.01)

(56) References Cited

U.S. PATENT DOCUMENTS

| | | | |
|---|---|---|---|
| 6,514,425 | B1 | 2/2003 | Sekiya et al. |
| 6,540,930 | B2 | 4/2003 | Kesari et al. |
| 7,279,451 | B2 | 10/2007 | Singh et al. |
| 7,547,635 | B2 | 6/2009 | Eppler et al. |
| 8,065,882 | B2 | 11/2011 | Singh et al. |
| 8,487,144 | B2 | 7/2013 | Hamasaki et al. |
| 8,518,293 | B2 * | 8/2013 | Hulse et al. ............. 252/67 |
| 2003/0019841 | A1 | 1/2003 | Kesari et al. |
| 2003/0232504 | A1 | 12/2003 | Eppler et al. |
| 2004/0256594 | A1 | 12/2004 | Singh et al. |
| 2005/0266691 | A1 | 12/2005 | Gu et al. |
| 2007/0290177 | A1 | 12/2007 | Singh et al. |
| 2008/0191163 | A1 | 8/2008 | Mocella |
| 2009/0043137 | A1 * | 2/2009 | Wang et al. ............. 570/136 |
| 2009/0209791 | A1 * | 8/2009 | Van Der Puy et al. ....... 570/156 |
| 2009/0278076 | A1 | 11/2009 | Singh et al. |
| 2011/0112339 | A1 * | 5/2011 | Wang et al. ............. 570/156 |
| 2011/0172470 | A1 | 7/2011 | Hamasaki et al. |

FOREIGN PATENT DOCUMENTS

| | | |
|---|---|---|
| JP | 10-140151 A | 5/1998 |
| JP | 10-223614 A | 8/1998 |
| JP | 2002-530863 A | 9/2002 |
| JP | 3465865 B2 | 8/2003 |
| JP | 2003-282538 A | 10/2003 |
| JP | 2004-536448 A | 12/2004 |
| JP | 2005-530345 A | 10/2005 |
| JP | 3821514 B2 | 9/2006 |
| JP | 2007-535611 A | 12/2007 |
| JP | 2007-537602 A | 12/2007 |
| JP | 2009-269892 A | 11/2009 |
| JP | 2010-64990 A | 3/2010 |
| WO | WO 2009/122771 A1 | 10/2009 |

OTHER PUBLICATIONS

Japanese-language Written Opinion dated Sep. 6, 2011 (PCT/ISA/237) (three (3) pages).

Shingo Nakamura et al., "Comparative Studies of Perfluorocarbon Alternative Gas Plasmas for Contact Hole Etch", J. Appl. Phys. vol. 42, No. 9, 2003, pp. 5759-5764.

"Standard Test Method for Concentration Limits of Flammability of Chemicals", ASTM E681-85, 1985, pp. 416-422.

Chinese Office Action dated Nov. 18, 2014 (7 pages).

* cited by examiner

DRY ETCHING AGENT AND DRY ETCHING METHOD

TECHNICAL FIELD

The present invention relates to a dry etching agent containing 1,1,1,3-tetrafluoropropene and a dry etching method using the dry etching agent.

BACKGROUND ART

In response to the recent demand for very fine processing techniques in the field of semiconductor manufacturing, dry etching has become mainstream in place of wet processing. The dry etching is a technique for forming a fine pattern on a molecular basis on a material surface by generation of plasma in a vacuum space.

For etching of semiconductor material e.g. silicon dioxide ($SiO_2$), perfluorocarbon (PFC) and hydrofluorocarbon (HFC) compounds such as $CF_4$, $CHF_3$, $C_2F_6$, $C_3F_8$ and $C_4F_8$ have been used as etching agents in order to increase the etching rate of $SiO_2$ relative to substrate material e.g. silicon, polysilicon or silicon nitride. However, these PFC and HFC compounds are specified as emission control materials in the Kyoto protocol (COP3) because each of these PFC and HFC compounds has a long atmospheric lifetime and a high global warming potential (GWP). The semiconductor industry thus has a demand for alternative low-GWP materials of high cost efficiency and capable of fine processing.

Patent Document 1 discloses the use of a reactive gas containing a $C_4$-$C_7$ perfluoroketone as a cleaning gas or etching gas in place of PFC of HFC gas. This reactive gas is not however always favorable as the etching gas due to the fact that, when the $C_4$-$C_7$ perfluoroketone gets decomposed, the resulting decomposition product contains a considerable amount of high-GWP PFC compound and relatively high-boiling substances.

Patent Document 2 discloses the use of a $C_2$-$C_6$ hydrofluoroether as a dry etching gas. However, the $C_2$-$C_6$ hydrofluoroether is generally high in GWP and is not favorable in terms of global environmental perspective as in the case of Patent Document 1.

Under the above circumstances, there has been a demand to develop lower-GWP compounds industrially easy to produce. In particular, it has been examined to apply unsaturated fluorocarbons having a double or triple bond in their respective molecules for etching process.

As a technique relevant to such application, Patent Document 3 discloses a method of etching a Si film, a $SiO_2$ film, a $Si_3N_4$ film or a high-melting metal silicide film with the use of an ether such as $C_aF_{2a+1}OCF=CF_2$ or a fluorinated olefin such as $CF_3CF=CFH$ or $CH_3CH=CH_2$.

Further, Patent Document 4 discloses a plasma etching method using hexafluoro-2-butyne, hexafluoro-1,3-butadiene, hexafluoropropene or the like as an etching gas.

Patent Document 5 discloses a method of etching an oxide layer on a non-oxide layer e.g. nitride layer with the use of a mixed gas containing: (a) an unsaturated fluorocarbon selected from the group consisting of hexafluorobutadiene, octafluoropentadiene, pentafluoropropene and trifluoropropyne; (b) a hydrofluoro methane such as monofluoromethane or difluoromethane; and (c) an inert carrier gas.

Patent Document 6 discloses the use of a $C_5$-$C_6$ acyclic perfluoroalkyne as a plasma reaction gas. Patent Document 7 discloses a method of producing a perfluoroalkene compound suitable for use as a dry etching gas or CVD gas and as a raw material of fluorine-containing polymers.

Patent Document 8 discloses the use of 1,3,3,3-tetrafluoropropene as an assist gas in laser-assisted etching. The laser-assisted etching is a technique of etching a material with an etchant by thermal activation of the material and excitation of the etchant under irradiation of a laser light and is basically different in excitation means from the dry etching in which a reactive gas is generated by the action of electric energy to react with a substrate and form a desired shape on the substrate.

Patent Document 9 discloses the use of a gas containing 2,3,3,3-tetrafluoropropene as an etching gas for a silicon oxide film. Herein, 2,3,3,3-tetrafluoropropene has also been developed as a coolant for a car air conditioner and exhibits a combustion range in a dry condition at ambient temperature (as measured according to ASTM E681-04). On the other hand, 1,3,3,3-tetrafluoropropene does not exhibit a combustion range under the same measurement conditions and thus can be regarded as a higher safety material.

Furthermore, Non-Patent Document 1 discloses the use of a straight-chain unsaturated compound such as hexafluoropropene or hexafluorobutadiene for etching of silicon oxide material.

PRIOR ART DOCUMENTS

Patent Documents

Patent Document 1: Published Japanese Translation of PCT International Application No. 2004-536448
Patent Document 2: Japanese Laid-Open Patent Publication No. H10-140151
Patent Document 3: Japanese Laid-Open Patent Publication No. H10-223614
Patent Document 4: Japanese Laid-Open Patent Publication No. H9-191002
Patent Document 5: Published Japanese Translation of PCT International Application No. 2002-530863
Patent Document 6: Japanese Laid-Open Patent Publication No. 2003-282538
Patent Document 7: Japanese Laid-Open Patent Publication No. 2009-269892
Patent Document 8: U.S. Patent Application Publication No. 2008/191163
Patent Document 9: PCT International Application Publication No. 2009/122771

Non-Patent Document

Non-Patent Document 1: J. Appl. Phys., Vol. 42, P. 5759-5764, 2003

DISCLOSURE OF THE INVENTION

As mentioned above, the PFC and HFC compounds are specified as emission control materials because of their high GWP. Although the perfluoroketone, hydrofluoro ether and hydrofluoro vinyl ether are known as alternatives to the PFC and HFC compounds, these alternative compounds have the problems that: when the alternative compound gets decomposed, the resulting decomposition product contains a considerable amount of high-GWP PFC compound; and the alternative compound is not easy to produce and is not economical. There has thus been a demand to develop a dry etching agent having not only less effect on the global environment but also performance required.

As to etching performance, plasma etching allows e.g. isotropic etching of SiO₂ by generation of F radicals from CF₄ gas. In dry etching where fine processing is required, however, it is desirable to use an etching agent having directivity in anisotropic etching rather than in isotopic etching. It is further demanded that the etching agent has less effect on the global environment as well as high cost efficiency.

Any of the techniques using the conventional etching gases requires complicated process and equipment, limited temperature conditions and operations such as application of vibration to the substrate and gas as in the case of Patent Document 5 and thus presents the problem of a narrow process window.

It is accordingly an object of the present invention to provide a dry etching agent capable of securing a wide process window and obtaining a good processing shape without the use of any special equipment by optimization of gas molecular structure and gas composition. It is also an object of the present invention to provide a dry etching method using such a dry etching agent.

Means for Solving the Problems

As a result of extensive researches, the present inventors have found 1,3,3,3-tetrafluoropropene (CF₃CH═CFH) as an alternative material suitable for anisotropic dry etching, capable of forming a good processing shape and having less effect on the global environment.

Namely, the present invention includes [Inventive Aspect 1] to [Inventive Aspect 8] as set forth below.

[Inventive Aspect 1]
A dry etching agent comprising 1,3,3,3-tetrafluoropropene, an additive gas and an inert gas.

[Inventive Aspect 2]
The dry etching agent according to Inventive Aspect 1, wherein the additive gas is an oxidizing gas or reducing gas.

[Inventive Aspect 3]
The dry etching agent according to Inventive Aspect 2, wherein the oxidizing gas or reducing gas is at least one kind of gas selected from the group consisting of H₂, O₂, O₃, CO, CO₂, COCl₂, COF₂, CF₃OF, NO₂, F₂, NF₃, Cl₂, Br₂, I₂, CH₄, C₂H₂, C₂H₄, C₂H₆, C₃H₄, C₃H₆, C₃H₈, HF, HI, HBr, HCl, NO, NH₃ and YFn (where Y represents Cl, Br or I; and n represents an integer satisfying 1≤n≤7).

[Inventive Aspect 4]
The dry etching agent according to Inventive Aspect 1, wherein the inert gas is at least one kind of gas selected from the group consisting of N₂, He, Ar, Ne and Kr.

[Inventive Aspect 5]
The dry etching agent according to Inventive Aspect 1, wherein the 1,3,3,3-tetrafluoropropene is contained in an amount of 1 to 45 volume %.

[Inventive Aspect 6]
The dry etching agent according to any one of Inventive Aspects 1 to 5, further comprising at least one kind of gas selected from the group consisting of CF₄, CF₃H, CF₂H₂, CFH₃, C₂F₆, C₂F₄H₂, C₂F₅H, C₃F₈, C₃F₇H, C₃F₆H₂, C₃F₅H₃, C₃F₄H₄, C₃F₄H₂, C₃F₃H₅, C₃F₅H, C₃F₃H, C₃ClF₃H, C₄F₈, C₄F₆, C₅F₈ and C₅F₁₀.

[Inventive Aspect 7]
A dry etching method for selectively etching at least one kind of silicon material selected from the group consisting of silicon dioxide, silicon nitride, polycrystalline silicon, amorphous silicon and silicon carbide by generation of a plasma gas from the dry etching agent according to any one of Inventive Aspects 1 to 6.

[Inventive Aspect 8]
A dry etching method for selectively etching at least one kind of silicon material selected from the group consisting of silicon dioxide, silicon nitride, polycrystalline silicon, amorphous silicon and silicon carbide by feeding (A) 1,3,3,3-tetrafluoropropene, (B) at least one kind of gas selected from the group consisting of H₂, O₂, CO and COF₂ and Ar at a volumetric flow rate ratio of (A):(B):Ar=1 to 45%:1 to 50%:5 to 98% (where the sum of the percentages of the respective gases is 100%).

It is already known that 1,1,1,2,3-pentafluoropropene, hexafluoro-2-butyne, hexafluoro-1,3-butadiene, hexafluoropropene etc. are usable as etching gases as mentioned above. The use of such fluorinated olefin compounds appears to be favorable because each of the fluorinated olefin compounds contains a plurality of fluorine atoms in itself and shows a high etching rate against silicon oxide material. However, these fluorinated olefin compounds are rather difficult to produce due to the presence of a plurality of double bonds or triple bonds in their respective molecules.

Although 1,1,1,2,3-pentafluoropropene, which is an analog to the target compound of the present invention, is disclosed in Patent Document 3, there is no disclosure about examples of practical applications of 1,1,1,2,3-pentafluoropropene for etching process. It has been unknown whether the target compound of the present invention has a high selectivity and a sufficient etching rate against various materials for use in industrial applications.

The dry etching agent according to the present invention is in the form of a mixed gas of 1,3,3,3-tetrafluoropropene (CF₃CH═CFH), additive gas such as H₂, O₂, O₃, CO, CO₂, COCl₂, CF₃OF, COF₂, NO₂, F₂, NF₃, Cl₂, Br₂, I₂, CH₄, C₂H₂, C₂H₄, C₂H₆, C₃H₄, C₃H₆, C₃H₈, HF, HI, HBr, HCl, NO, NH₃, YFn (where Y represents Cl, Br or I; and n represents an integer satisfying 1≤n≤7) etc. and inert gas such as N₂, He, Ar etc. It is possible to efficiently etch the silicon material layer with a high selectivity and a high etching rate by the use of the 1,3,3,3-tetrafluoropropene in the coexistence of the specific additive gas and the specific inert gas. As the 1,3,3,3-tetrafluoropropene has not only a CF₃CH structure that can easily generate CF₃⁺ ions but also a double bond and hydrogen atoms in the molecule that can easily form polymer chains, the use of the 1,3,3,3-tetrafluoropropene is advantageous for wall protection and enables anisotropic etching. Preferably, the additive gas is added in a predetermined amount. In particular, it is possible to obtain a significant improvement in process window and address processing requirements such as low side etching ratio and high aspect ratio even without any special substrate excitation operation by the addition of oxidizing gas e.g. oxygen-containing gas or halogen-containing gas or reducing gas to the etching agent. Further, the 1,3,3,3-tetrafluoropropene has a single unsaturated double bond in the molecule and shows a high degradability by OH radials etc. in air and a much smaller contribution to the global warming than PFC and HFC compounds. There is thus less effect caused on the global environment by the use of the 1,3,3,3-tetrafluoropropene as the dry etching agent.

In this way, the dry etching agent according to the present invention is usable for practical applications with no problem and is very advantageous in terms of industrial and global environmental perspectives.

DETAILED DESCRIPTION

Figure 1:
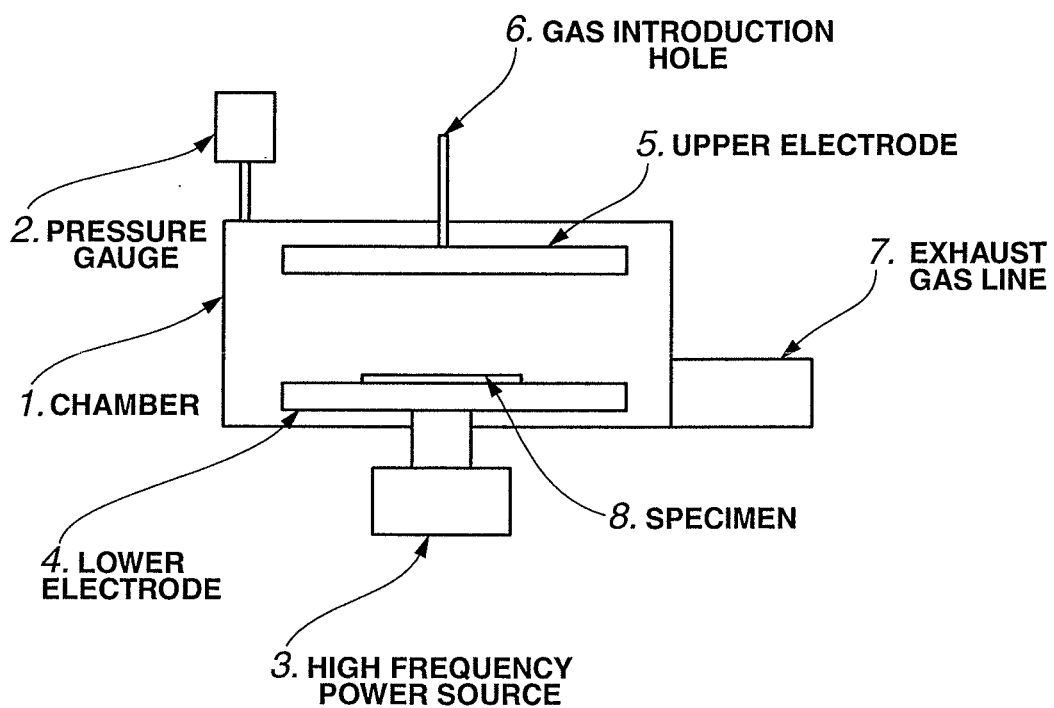
FIG. 1 is a schematic view of an experimental device used in the present invention.

Hereinafter, the dry etching agent according to the present invention will be described in detail.

The dry etching agent according to the present invention contains 1,3,3,3-tetrafluoropropene represented by the chemical formula: $CF_3CH=CFH$. More specifically, the dry etching agent according to the present invention is characterized in that the dry etching agent is in the form of a mixture of $CF_3CH=CFH$ with an additive gas and an inert gas, each of which is one kind or two or more kinds of organic or inorganic compounds different from $CF_3CH=CFH$. (As will be explained later in detail, the "additive gas" refers to an oxidizing gas such as $O_2$, $F_2$ etc. or a reducing gas such as $H_2$, CO etc. and may occasionally be designated as "oxidizing gas", "oxygen-containing gas", "halogen-containing gas" or "reducing gas" in the present specification.) The 1,3,3,3-tetrafluoropropene exists as stereoisomers: a trans isomer (E isomer) or a cis isomer (Z-isomer). In the present invention, the 1,3,3,3-tetrafluoropropene can be used in the form of either a trans isomer, a cis isomer or a mixture of trans and cis isomers.

It is feasible to prepare the 1,3,3,3-tetrafluoropropene by any known conventional method for use in the present invention. For example, the 1,3,3,3-tetrafluoropropene can be prepared by reacting 1-chloro-3,3,3-trifluoropropene, which is available on an industrial scale, with HF in the presence of a gas phase fluorination catalyst as disclosed in Japanese Patent No. 3465865 and No. 3821514. Alternatively, the 1,3,3,3-tetrafluoropropene can be prepared by catalytic decomposition of 1,1,3,3,3-pentafluoropropane in a gas phase as disclosed in Japanese Patent No. 3465865.

The 1,3,3,3-tetrafluoropropene has a double bond linked to a trifluoromethyl group ($CF_3$) via a single bond in the molecule and thus characteristically allows a double bond moiety thereof to be deposited by polymerization as well as allowing high-frequency generation of $CF_3^+$ ions that are high in etching efficiency.

It is preferable that the F/C ratio of the etching agent is as close to 1 as possible in order to cause polymerization of carbon atoms in the etching agent and prevent a side wall of the etching target material from being subjected to nonselective etching. In the present invention, it is assumed that the dry etching agent increases in selectivity for anisotropic etching over isotropic etching by F radicals due to the fact that the 1,3,3,3-tetrafluoropropene molecule has a small F/C ratio of 1.33 and makes it easier to protect the side wall of the etching target material by polymer deposition. A hydrogen-containing fluorinated propene is suitably used in order to decrease the F/C ratio of the etching agent. Although there can be listed 1,2,3,3,3-pentafluoropropene, 1,1,3,3,3-pentafluoropropene, 3,3,3-trifluoropropene etc. as such a fluorinated propene, the target compound of the present invention, that is, $CF_3CF=CFH$ is more preferred in terms of F/C ratio and combustibility.

The etching agent according to the present invention is applicable under various dry etching conditions. Various additives can be added to the etching agent depending on the physical properties, productivity, fine processing accuracy etc. of the etching target film.

In the present invention, the etching agent preferably contains 1 to 45 volume % of the 1,3,3,3-tetrafluoropropene in mixture with the following volume % ranges of the additive gas (oxidizing gas, oxygen-containing as, halogen-containing gas, reducing gas) and the inert gas.

Specific examples of the inert gas are $N_2$, He, Ar, Ne and Kr. These inert gases are also usable as a diluent. In particular, the use of Ar leads to a higher etching rate by the synergistic effect with the 1,3,3,3-tetrafluoropropene.

The amount of the inert gas added is determined in accordance with the configuration and performance such as output, exhaust capacity etc. of the equipment and the characteristic properties of the etching target film. The inert gas is preferably added in such a manner that the flow rate of the inert gas is 1 to 50 times the flow rate of the 1,3,3,3-tetrafluoropropene.

The oxidizing gas is preferably added in order to increase the etching rate for improvement in productivity. Specific examples of the oxidizing gas are: oxygen-containing gases such as $O_2$, $O_3$, CO, $CO_2$, $COCl_2$, $COF_2$ and $NO_2$; and fluorine-containing gases such as $F_2$, $NF_3$, $Cl_2$, $Br_2$, $I_2$ and YFn (where Y=Cl, Br or I; and $1 \leq n \leq 7$). Among others, $O_2$, $COF_2$, $F_2$, $NF_3$ and $Cl_2$ are preferred for increase in metal etching rate. Particularly preferred is $O_2$. The above oxidizing gases can be used solely or in combination of two or more thereof. The oxidizing gas can be adjusted as appropriate by any skilled in the art.

The amount of the oxidizing gas added is determined in accordance with the configuration and performance such as output etc. of the equipment and the characteristic properties of the etching target film. In general, the oxidizing gas is added in such a manner that the flow rate of the oxidizing gas is $\frac{1}{10}$ to 30 times, preferably $\frac{1}{10}$ to 20 times, the flow rate of the 1,3,3,3-tetrafluoropropene. If the flow rate of the oxidizing gas exceeds 30 times the flow rate of the 1,3,3,3-tetrafluoropropene, the good anisotropic etching performance of the 1,3,3,3-tetrafluoropropene may be impaired. If the flow rate of the oxidizing gas is less than $\frac{1}{10}$ times the flow rate of the 1,3,3,3-tetrafluoropropene, there occurs a significant increase in the amount of deposit caused by polymerization of the 1,3,3,3-tetrafluoropropene. The use of oxygen as the oxidizing gas leads to selective acceleration of metal etching, that is, provides a significant increase in selectivity for etching of a metal relative to an oxide so as to thereby enable selective metal etching.

In the present invention, the inert gas such as $N_2$, He, Ar, Ne, Kr etc. is added together with the oxidizing gas.

As mentioned above, it is one preferred embodiment of the present invention to contain the 1,3,3,3-tetrafluoropropene, the oxidizing gas and the inert gas in the dry etching agent. The preferred composition of the etching agent will be explained below in units of volume % assuming that the sum of the volume % of the respective gases is 100 volume %.

In the case where the 1,3,3,3-tetrafluoropropene, the oxidizing gas and the inert gas coexist with one another, the volume % ratio of the 1,3,3,3-tetrafluoropropene, the oxidizing gas and the inert gas is preferably in the range of 1,3,3,3-tetrafluoropropene:oxidizing gas:inert gas=1 to 45%:1 to 50%:5 to 98%, more preferably 4 to 40%:4 to 45%:15 to 92%. When two or more kinds of oxidizing gases or inert gases are used in combination, the total volume ratio of the oxidizing gases or inert gases is adjusted to within the above range.

In the present invention, any gas selected from $CF_4$, $CF_3H$, $CF_2H_2$, $CFH_3$, $C_2F_6$, $C_2F_4H_2$, $C_2F_5H$, $C_3F_8$, $C_3F_7H$, $C_3F_6H_2$, $C_3F_5H_3$, $C_3F_4H_4$, $C_3F_4H_2$, $C_3F_3H_5$, $C_3F_5H$, $C_3F_3H$, $C_3ClF_3H$, $C_4F_8$, $C_4F_6$, $C_5F_B$, $C_5F_{10}$ etc. can suitably be added into the dry etching agent in order to change the F/C ratio of the etching gas. The amount of this gas compound added is favorably determined in such a manner as to change the F/C ratio without inhibiting selective etching and is preferably 0.01 to 2 times in volume the amount of the 1,3,3,3-tetrafluoropropene. Among the compounds other than the 1,3,3,3-tetrafluoropropene, 2,3,3,3-tetrafluoropropene ($C_3F_4H_2$) or the like can also be used in combination because it does not change the F/C ratio but has some effect such as side wall protection.

Further, it is effective to add the reducing gas in order to reduce the amount of F radicals that accelerate isotropic etching. Specific examples of the reducing gas are $CH_4$, $C_2H_2$, $C_2H_4$, $C_2H_6$, $C_3H_4$, $C_3H_6$, $C_3H_8$, HF, HI, HBr, HCl, NO, $NH_3$ and $H_2$.

If the reducing gas is added in too large amount, there may occur a deterioration in productivity due to significant reduction of F radicals that work on etching. In particular, the use of $H_2$ or $C_2H_2$ does not cause a change in etching rate of $SiO_2$ but causes a decrease in etching rate of Si so as to thereby increase the etching selectivity for selective etching of $SiO_2$ relative to the silicon substrate.

The dry etching method using the dry etching agent according to the present invention will be next described below in detail.

The dry etching agent according to the present invention can be applied for etching of various workpieces such as film layers of B, P, W, Si, Ti, V, Nb, Ta, Se, Te, Mo, Re, Os, Ru, Ir, Sb, Ge, Au, Ag, As, Cr and compounds thereof e.g. oxides, nitrides, carbides, fluorides, oxyfluorides, silicides, alloys etc. formed on substrates e.g. silicon wafer, metal plate, glass substrate, single crystal substrate or polycrystal substrate.

The dry etching agent can particularly effectively be applied to a semiconductor material. Specific examples of the semiconductor material are silicon materials such as silicon, silicon dioxide, silicon nitride, silicon carbide, silicon oxyfluoride and silicon oxycarbide, tungsten, rhenium and silicides thereof, titanium, titanium nitride, ruthenium, ruthenium silicide, ruthenium nitride, tantalum, tantalum oxide, tantalum oxyfluoride, hafnium, hafnium oxide, hafnium oxysilicide and hafnium zirconium oxide.

There is no particular limitation on the etching technique and reaction conditions in the dry etching method using the dry etching agent according to the present invention. There can be adopted various etching techniques such as reactive ion etching (RIE), electron cyclotron resonance (ECR) plasma etching and microwave etching. In the present invention, the dry etching method can be performed by generating plasma of the target propene gas in the etching treatment equipment such that the generated plasma etches a given region of the workpiece placed in the equipment. For example, it is feasible to apply the dry etching method for manufacturing of semiconductor devices by forming a silicon oxide film or silicon nitride film on a silicon wafer, applying a resist with a given opening onto the silicon oxide film or silicon nitride film, and then, performing etching on the resist opening to remove therefrom some part of the silicon oxide film or silicon nitride film.

The dry etching method using the dry etching agent according to the present invention can also be applied for manufacturing of so-called microelectromechanical systems (MEMS) in each of which machine element parts, sensor, actuator and electronic circuit are laminated on one silicon substrate, glass substrate, organic material etc. It is further feasible to manufacture MEMS semiconductor devices such as magnetic recording head, pressure sensor and accelerator sensor in existing products by application of the dry etching method according to the present invention.

There is no particular limitation on the plasma generator used in the etching treatment. For example, there can preferably used a high-frequency induction type plasma generator, a microwave type plasma generator etc.

During the etching treatment, the gas pressure is preferably 0.133 to 133 Pa for efficient anisotropic etching. If the gas pressure is lower than 0.133 Pa, the etching rate may be lowered. The resist selectivity may be impaired if the gas pressure exceeds 133 Pa.

The volumetric flow rate ratio of the 1,3,3,3-tetrafluoropropene, the additive gas and the inert gas during the etching treatment is controlled to the same volume % ratio as mentioned above.

Further, the flow rate of the gases used depends on the size of the etching equipment and can be adjusted as appropriate by any skilled in the art in accordance with the etching equipment.

The temperature during the etching treatment is preferably 300° C. or lower. It is particularly preferable to set the etching treatment temperature to be 240° C. or lower for anisotropic etching. Under high-temperature conditions exceeding 300° C., there arises a strong tendency to cause isotropic etching so that required processing accuracy cannot be obtained. In addition, the resist is unfavorably significantly etched under such high-temperature conditions.

There is no particular limitation on the reaction time of the etching treatment. The reaction time is generally of the order of 5 to 30 minutes. As the reaction time depends on the status after the etching treatment, it is desirable to adjust the reaction time as appropriate while monitoring the progress of the etching treatment.

The selectivity of the etching agent for etching of silicon oxide film relative to silicon during contact-hole processing can be improved by adding the reducing gas as mentioned above and/or optimizing the gas pressure, flow rate, temperature etc. during the etching treatment.

EXAMPLES

The present invention will be described in more detail below by way of the following examples. It should be noted that these examples are illustrative and are not intended to limit the present invention thereto.

In Examples 1 to 10, the dry etching agent according to the present invention was applied for contact-hole processing to perform etching treatment on an interlayer dielectric film ($SiO_2$) or a silicon nitride film. In comparison, etching treatment was performed using $CF_4$ as a perfluorocarbon, $F_2$ or $C_4F_6$ ($CF_2$=CF—CF=$CF_2$) as a diolefin in Comparative Examples 1 to 12.

FIG. 1 is a schematic view of an experimental device used in the respective examples.

In the experimental device, a process gas was introduced into a chamber 1 through a gas introduction hole 6 that was connected to an upper electrode 5 in the chamber 1. Subsequently, the pressure inside the chamber 1 was set to 2Pa. The process gas was then excited by means of a high frequency power source 3 (13.5 MHz, 0.22 W/cm$^2$), thereby generating active species. The generated active species were supplied to a specimen 8 that was placed on a lower electrode 4, such that the specimen 8 was etched by the active species.

Herein, the specimen 8 used was those prepared by forming a $SiO_2$ film or silicon nitride film of 5 Elm thickness on a single crystal silicon wafer and applying a resist with an opening of 0.3 μm line width onto the film.

The etching treatment was conducted for 30 minutes at a process pressure of 2 Pa with the use of a mixed gas containing either $C_4F_6$, $CF_4$, $F_2$, trans-1,3,3,3-tetrafluoropropene (abbreviated as "1234ze(E)") or mixed gas of 1234ze(E) and 2,3,3,3-tetrafluoropropene (abbreviated as "1234yf") (volume ratio: 80/20) and oxygen as the process gas.

Figure 2:
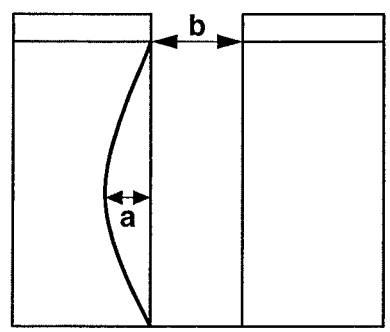
FIG. 2 is a diagram showing an opening formed in a silicon wafer by etching.

After the etching treatment, the silicon wafer sample was tested by SEM cross-sectional observation for comparison of the etching rate, the aspect ratio and the ratio of side etching (the amount of etching of the side wall) relative to the opening line width. The side etching ratio R (%) was herein determined by the following equation: $R=(a/b)\times100$ as shown in FIG. 2. The etching test results are indicated in TABLE 1.

TABLE 1

| | Kind of film | Etching gas | Flow rate sccm | Oxygen Flow rate sccm | Hydrogen Flow rate sccm | Ar Flow rate sccm |
|---|---|---|---|---|---|---|
| Example 1 | $SiO_2$ | 1234ze(E) | 25 | 25 | 0 | 500 |
| Example 2 | $SiO_2$ | 1234ze(E) | 20 | 30 | 0 | 500 |
| Example 3 | silicon nitride | 1234ze(E) | 25 | 25 | 0 | 500 |
| Example 4 | silicon nitride | 1234ze(E) | 20 | 30 | 0 | 500 |
| Example 5 | $SiO_2$ | 1234ze(E) + 1234yf | 15 | 20 | 0 | 500 |
| Example 6 | silicon nitride | 1234ze(E) + 1234yf | 15 | 20 | 0 | 500 |
| Example 7 | $SiO_2$ | 1234ze(E) | 25 | 23 | 2 | 500 |
| Example 8 | silicon nitride | 1234ze(E) | 25 | 23 | 2 | 500 |
| Example 9 | $SiO_2$ | 1234ze(E) + 1234yf | 15 | 19 | 1 | 500 |
| Example 10 | silicon nitride | 1234ze(E) + 1234yf | 15 | 19 | 1 | 500 |
| Comparative Example 1 | $SiO_2$ | $CF_4$ | 25 | 25 | 0 | 500 |
| Comparative Example 2 | $SiO_2$ | $CF_4$ | 20 | 30 | 0 | 500 |
| Comparative Example 3 | silicon nitride | $CF_4$ | 25 | 25 | 0 | 500 |
| Comparative Example 4 | silicon nitride | $CF_4$ | 20 | 30 | 0 | 500 |
| Comparative Example 5 | $SiO_2$ | $C_4F_6$ | 25 | 25 | 0 | 500 |
| Comparative Example 6 | $SiO_2$ | $C_4F_6$ | 20 | 30 | 0 | 500 |
| Comparative Example 7 | silicon nitride | $C_4F_6$ | 25 | 25 | 0 | 500 |
| Comparative Example 8 | silicon nitride | $C_4F_6$ | 20 | 30 | 0 | 500 |
| Comparative Example 9 | $SiO_2$ | $F_2$ | 45 | 5 | 0 | 500 |
| Comparative Example 10 | silicon nitride | $F_2$ | 45 | 5 | 0 | 500 |
| Comparative Example 11 | $SiO_2$ | $C_4F_6$ | 25 | 23 | 2 | 500 |
| Comparative Example 12 | silicon nitride | $C_4F_6$ | 20 | 25 | 5 | 500 |

| | Etching rate nm/min | Aspect ratio | Side etching ratio R |
|---|---|---|---|
| Example 1 | 78 | 7 or greater | <1% |
| Example 2 | 85 | 7 or greater | 1.30% |
| Example 3 | 94 | 6 | <1% |
| Example 4 | 103 | 6 | 2.40% |
| Example 5 | 63 | 6 | <1% |
| Example 6 | 78 | 6 | <1% |
| Example 7 | 74 | 7 or greater | <1% |
| Example 8 | 91 | 7 or greater | <1% |
| Example 9 | 59 | 6 | <1% |
| Example 10 | 71 | 6 | <1% |
| Comparative Example 1 | 97 | 4 | 4.00% |
| Comparative Example 2 | 104 | 4 | 15.20% |
| Comparative Example 3 | 95 | 3 | 5.60% |
| Comparative Example 4 | 99 | 3 | 17.30% |
| Comparative Example 5 | 84 | 6 | 2.00% |
| Comparative Example 6 | 88 | 6 | 6.00% |
| Comparative Example 7 | 65 | 4 | 5.20% |
| Comparative Example 8 | 71 | 4 | 8.40% |
| Comparative Example 9 | 235 | 3 | 35.20% |
| Comparative Example 10 | 294 | 2 | 46.50% |
| Comparative Example 11 | 41 | 3 | 3.20% |
| Comparative Example 12 | 61 | 4 | 9.50% |

The invention claimed is:

1. A dry etching method for selectively etching a silicon material, the dry etching method comprising:
   generating a plasma gas from a dry etching agent; and
   etching the silicon material by the generated plasma gas,
   wherein the dry etching agent comprises 1,3,3,3-tetrafluoropropene, an additive gas and an inert gas; and
   wherein the silicon material is at least one kind selected from the group consisting of silicon dioxide, silicon nitride, polycrystalline, silicon, amorphous silicon and silicon carbide.

2. The dry etching method according to claim 1, wherein the additive gas is an oxidizing gas or reducing gas.

3. The dry etching method according to claim 2, wherein the oxidizing gas or reducing gas is at least one kind of gas selected from the group consisting of $H_2$, $O_2$, $O_3$, CO, $CO_2$, $COCl_2$, $COF_2$, $CF_3OF$, $NO_2$, $F_2$, $NF_3$, $Cl_2$, $Br_2$, $I_2$, $CH_4$, $C_2H_2$, $C_2H_4$, $C_2H_6$, $C_3H_4$, $C_3H_6$, $C_3H_8$, HF, HI, HBr, HCl, NO, $NH_3$ and $YF_n$ (where Y represents Cl, Br or I; and n represents an integer satisfying $1\leq n\leq 7$).

4. The dry etching method according to claim 1, wherein the inert gas is at least one kind of gas selected from the group consisting of $N_2$, He, Ar, Ne and Kr.

5. The dry etching method according to claim 1, wherein the 1,3,3,3-tetrafluoropropene is contained in an amount of 1 to 45 volume %.

6. The dry etching method according to claim 1, further comprising at least one kind of gas selected from the group consisting of $CF_4$, $CF_3H$, $CF_2H_2$, $CFH_3$, $C_2F_6$, $C_2F_4H_2$, $C_2F_5H$, $C_3F_8$, $C_3F_7H$, $C_3F_6H_2$, $C_3F_5H_3$, $C_3F_4H_4$, $C_3F_4H_2$, $C_3F_3H_5$, $C_3F_5H$, $C_3F_3H$, $C_4F_8$, $C_4F_6$, $C_5F_8$ and $C_5F_{10}$.

7. The dry etching method according to claim 1, wherein the dry etching agent contains at least one kind of oxidizing gas selected from the group consisting of $H_2$, $O_2$, CO and $COF_2$ as the additive gas and Ar as the inert gas; and wherein the 1,3,3,3-tetrafluoropropene, the additive gas and the inert gas are fed at a volumetric flow rate ratio of 1,3,3,3-tetrafluoropropene:additive gas:inert gas=1 to 45%:1 to 50%:5 to 98% (where the sum of the percentages of the respective gases is 100%).

8. A dry etching agent comprising 1,3,3,3-tetrafluoropropene, an additive gas and an inert gas,
   wherein the dry etching is for use in selectively etching of a silicon material;
   wherein the additive gas is at least one kind of oxidizing or reducing gas selected from the group consisting of $H_2$, $O_2$, $O_3$, CO, $CO_2$, $COCl_2$, $COF_2$, $CF_3OF$, $NO_2$, $F_2$, $NF_3$, $Cl_2$, $Br_2$, $I_2$, $CH_4$, $C_2H_2$, $C_2H_4$, $C_2H_6$, $C_3H_4$, $C_3H_6$, $C_3H_8$, HF, HI, HBr, HCl, NO, $NH_3$ and $YFn$ (where Y represents Cl, Br or I; and n represents an integer satisfying $1 \leq n \leq 7$);
   wherein the inert gas is at least one kind of gas selected from the group consisting of $N_2$, He, Ar, Ne and Kr; and
   wherein the 1,3,3,3-tetrafluoropropene is contained in an amount of 1 to 45 volume %.

9. The dry etching agent according to claim 8, further comprising at least one kind of gas selected from the group consisting of $CF_4$, $CF_3H$, $CF_2H_2$, $CFH_3$, $C_2F_6$, $C_2F_4H_2$, $C_2F_5H$, $C_3F_8$, $C_3F_7H$, $C_3F_6H_2$, $C_3F_5H_3$, $C_3F_4H_4$, $C_3F_4H_2$, $C_3F_3H_5$, $C_3F_5H$, $C_3F_3H$, $C_4F_8$, $C_4F_6$, $C_5F_8$ and $C_5F_{10}$.

10. The dry etching agent according to claim 8,
    wherein the 1,3,3,3-tetrafluoropropene, the additive gas and the inert gas are at a volumetric flow rate ratio of 1,3,3,3-tetrafluoropropene:additive gas:inert gas=1 to 45%:1 to 50%:5 to 98% (where the sum of the percentages of the respective gases is 100%).

11. A dry etching agent consisting essentially of:
    1 to 45 volume % of 1,3,3,3-tetrafluoropropene;
    at least one kind of oxidizing or reducing gas selected, as an additive gas, from the group consisting of $H_2$, $O_2$, $O_3$, CO, $CO_2$, $COCl_2$, $COF_2$, $CF_3OF$, $NO_2$, $F_2$, $NF_3$, $Cl_2$, $Br_2$, $I_2$, $CH_4$, $C_2H_2$, $C_2H_4$, $C_2H_6$, $C_3H_4$, $C_3H_6$, $C_3H_8$, HF, HI, HBr, HCl, NO, $NH_3$ and $YFn$ (where Y represents Cl, Br or I; and n represents an integer satisfying $1 \leq n \leq 7$); and
    at least one kind of inert gas selected from the group consisting of $N_2$, He, Ar, Ne and Kr.

12. A dry etching method for selectively etching at least one kind of silicon material selected from the group consisting of silicon dioxide, silicon nitride, polycrystalline silicon, amorphous silicon and silicon carbide by generation of a plasma gas from the dry etching agent according to claim 11.

13. The dry etching method according to claim 12,
    wherein the dry etching agent contains at least one kind of oxidizing gas selected from the group consisting of $H_2$, $O_2$, CO and $COF_2$ as the additive gas and Ar as the inert gas; and
    wherein the 1,3,3,3-tetrafluoropropene, the additive gas and the inert gas are fed at a volumetric flow rate ratio of 1,3,3,3-tetrafluoropropene:additive gas:inert gas=1 to 45%:1 to 50%:5 to 98% (where the sum of the percentages of the respective gases is 100%).

14. A dry etching agent consisting essentially of:
    1 to 45 volume % of 1,3,3,3-tetrafluoropropene;
    at least one kind of oxidizing or reducing gas selected, as an additive gas, from the group consisting of $H_2$, $O_2$, $O_3$, CO, $CO_2$, $COCl_2$, $COF_2$, $CF_3OF$, $NO_2$, $F_2$, $NF_3$, $Cl_2$, $Br_2$, $I_2$, $CH_4$, $C_2H_2$, $C_2H_4$, $C_2H_6$, $C_3H_4$, $C_3H_6$, $C_3H_8$, HF, HI, HBr, HCl, NO, $NH_3$ and $YFn$ (where Y represents Cl, Br or I; and n represents an integer satisfying $1 \leq n \leq 7$);
    at least one kind of inert gas selected from the group consisting of $N_2$, He, Ar, Ne and Kr; and
    at least one kind of gas selected from the group consisting of $CF_4$, $CF_3H$, $CF_2H_2$, $CFH_3$, $C_2F_6$, $C_2F_4H_2$, $C_2F_5H$, $C_3F_8$, $C_3F_7H$, $C_3F_6H_2$, $C_3F_5H_3$, $C_3F_4H_4$, $C_3F_4H_2$, $C_3F_3H_5$, $C_3F_5H$, $C_3F_3H$, $C_4F_8$, $C_4F_6$, $C_5F_8$ and $C_5F_{10}$.

15. A dry etching method for selectively etching at least one kind of silicon material selected from the group consisting of silicon dioxide, silicon nitride, polycrystalline silicon, amorphous silicon and silicon carbide by generation of a plasma gas from the dry etching agent according to claim 14.

16. The dry etching method according to claim 15,
    wherein the dry etching agent contains at least one kind of oxidizing gas selected from the group consisting of $H_2$, $O_2$, CO and $COF_2$ as the additive gas and Ar as the inert gas; and
    wherein the 1,3,3,3-tetrafluoropropene, the additive gas and the inert gas are fed at a volumetric flow rate ratio of 1,3,3,3-tetrafluoropropene:additive gas:inert gas=1 to 45%:1 to 50%:5 to 98% (where the sum of the percentages of the respective gases is 100%).

17. A dry etching agent consisting essentially of:
    1,3,3,3-tetrafluoropropene
    at least one kind of oxidizing or reducing gas selected, as an additive gas, selected from the group consisting of $H_2$, $O_2$, $O_3$, CO, $CO_2$, $COCl_2$, $COF_2$, $CF_3OF$, $NO_2$, $F_2$, $NF_3$, $C_{12}$, $Br_2$, $I_2$, $CH_4$, $C_2H_2$, $C_2H_4$, $C_2H_6$, $C_3H_4$, $C_3H_6$, $C_3H_8$, HF, HI, HBr, HCl, NO, $NH_3$ and $YFn$ (where Y represents Cl, Br or I; and n represents an integer satisfying $1 \leq n \leq 7$); and
    at least one kind of inert gas selected from the group consisting of $N_2$, He, Ar, Ne and Kr,
    wherein the 1,3,3,3-tetrafluoropropene, the additive gas and the inert gas are at a volumetric flow rate ratio of 1,3,3,3-tetrafluoropropene:additive gas:inert gas=1 to 45%:1 to 50%:5 to 98% (where the sum of the percentages of the respective gases is 100%).

18. A dry etching method for selectively etching at least one kind of silicon material selected from the group consisting of silicon dioxide, silicon nitride, polycrystalline silicon, amorphous silicon and silicon carbide by generation of a plasma gas from the dry etching agent according to claim 17.

19. A dry etching agent consisting essentially of:
    1,3,3,3-tetrafluoropropene
    at least one kind of oxidizing reducing gas selected, as an additive gas, selected from the group consisting of $H_2$, $O_2$, $O_3$, CO, $CO_2$, $COCl_2$, $COF_2$, $CF_3OF$, $NO_2$, $F_2$, $NF_3$, $Cl_2$, $Br_2$, $I_2$, $CH_4$, $C_2H_2$, $C_2H_4$, $C_2H_6$, $C_3H_4$, $C_3H_6$, $C_3H_8$, HF, HI, HBr, HCl, NO, $NH_3$ and $YFn$ (where Y represents Cl, Br or I; and n represents an integer satisfying $1 \leq n \leq 7$);
    at least one kind of inert gas selected from the group consisting of $N_2$, He, Ar, Ne and Kr; and
    at least one kind of gas selected from the group consisting of $CF_4$, $CF_3H$, $CF_2H_2$, $CFH_3$, $C_2F_6$, $C_2F_4H_2$, $C_2F_5H$, $C_3F_8$, $C_3F_7H$, $C_3F_6H_2$, $C_3F_5H_3$, $C_3F_4H_4$, $C_3F_4H_2$, $C_3F_3H_5$, $C_3F_5H$, $C_3F_3H$, $C_4F_8$, $C_4F_6$, $C_5F_8$ and $C_5F_{10}$,
    wherein the 1,3,3,3-tetrafluoropropene, the additive gas and the inert gas are fed at a volumetric flow rate ratio of 1,3,3,3-tetrafluoropropene:additive gas:inert gas=1 to 45%:1 to 50%:5 to 98% (where the sum of the percentages of the respective gases is 100%).

20. A dry etching method for selectively etching at least one kind of silicon material selected from the group consisting of silicon dioxide, silicon nitride, polycrystalline silicon, amorphous silicon and silicon carbide by generation of a plasma gas from the dry etching agent according to claim 19.

* * * * *